(12) United States Patent
McMorrow et al.

(10) Patent No.: US 7,805,115 B1
(45) Date of Patent: Sep. 28, 2010

(54) VARIABLE FILTER SYSTEMS AND METHODS FOR ENHANCED DATA RATE COMMUNICATION SYSTEMS

(75) Inventors: Robert J. McMorrow, Concord, MA (US); Roxann Blanchard, Bedford, MA (US)

(73) Assignee: Analog Devices, Inc., Norwood, MA (US)

( * ) Notice: Subject to any disclaimer, the term of this patent is extended or adjusted under 35 U.S.C. 154(b) by 673 days.

(21) Appl. No.: 10/858,723

(22) Filed: Jun. 2, 2004

Related U.S. Application Data

(60) Provisional application No. 60/475,193, filed on Jun. 2, 2003.

(51) Int. Cl.
*H04B 1/02* (2006.01)
*H03C 1/52* (2006.01)

(52) U.S. Cl. ............... 455/108; 455/126; 455/115.1; 455/127.1

(58) Field of Classification Search ............ 455/108, 455/126, 127.1, 115.1, 23, 24, 69, 71, 240.1, 455/102, 110; 330/125, 141, 75, 86, 105; 375/300, 302
See application file for complete search history.

(56) References Cited

U.S. PATENT DOCUMENTS

| | | | | |
|---|---|---|---|---|
| 3,891,926 A * | 6/1975 | Ishman et al. | ............... | 455/108 |
| 3,900,823 A * | 8/1975 | Sokal et al. | ............... | 330/149 |
| 3,939,431 A * | 2/1976 | Cohlman | ............... | 375/217 |
| 4,417,358 A * | 11/1983 | Zeis | ............... | 455/109 |
| 4,465,981 A * | 8/1984 | Pike | ............... | 330/281 |
| 4,618,999 A * | 10/1986 | Watkinson | ............... | 455/108 |
| 4,802,236 A * | 1/1989 | Walczak et al. | ............... | 455/110 |
| 5,179,353 A * | 1/1993 | Miyake | ............... | 330/129 |
| 5,212,814 A * | 5/1993 | Iwane | ............... | 455/107 |
| 5,408,197 A * | 4/1995 | Miyake | ............... | 330/129 |
| 5,606,284 A * | 2/1997 | Tamesue et al. | ............... | 330/129 |
| 5,625,647 A * | 4/1997 | Kawasaki | ............... | 375/295 |
| 5,675,609 A * | 10/1997 | Johnson | ............... | 375/237 |
| 5,697,074 A * | 12/1997 | Makikallio et al. | ............... | 455/126 |
| 6,034,999 A * | 3/2000 | Kirisawa | ............... | 375/295 |
| 6,127,890 A * | 10/2000 | Shimomura et al. | ............... | 330/254 |
| 6,137,362 A * | 10/2000 | Dufossez | ............... | 330/254 |
| 6,246,286 B1 * | 6/2001 | Persson | ............... | 330/149 |
| 6,252,915 B1 * | 6/2001 | Mollenkopf et al. | ............... | 375/297 |
| 6,259,321 B1 * | 7/2001 | Song et al. | ............... | 330/254 |
| 6,377,786 B2 * | 4/2002 | Mollenkopf et al. | ............... | 455/127.2 |
| 6,449,465 B1 * | 9/2002 | Gailus et al. | ............... | 455/126 |
| 6,480,705 B1 * | 11/2002 | Kusunoki | ............... | 455/126 |
| 6,580,901 B1 * | 6/2003 | Mochizuki | ............... | 455/127.1 |
| 6,621,344 B2 * | 9/2003 | Ritchie | ............... | 330/254 |
| 6,633,751 B1 * | 10/2003 | Damgaard et al. | ............... | 455/126 |

(Continued)

*Primary Examiner*—Edward Urban
*Assistant Examiner*—RuiMeng Hu
(74) *Attorney, Agent, or Firm*—Goodwin Procter LLP

(57) ABSTRACT

A radio frequency output power control system is disclosed for use in communication systems that use a modulation scheme having a non-constant amplitude envelope. The system includes a power amplifier having a radio frequency input node for receiving a radio frequency input signal, a power control node for receiving a filtered power control signal, and an output for providing an amplified output signal. The system also includes a variable filter that receives a power control signal at a power control input and a receives a trigger signal at a trigger input, and provides a filtered power control signal to the power control node of the power amplifier responsive to the power control signal and the trigger signal.

25 Claims, 9 Drawing Sheets

U.S. PATENT DOCUMENTS

| | | | |
|---|---|---|---|
| 6,650,875 B1 * | 11/2003 | Rozenblit et al. | 455/91 |
| 6,653,909 B2 * | 11/2003 | Nielsen | 332/151 |
| 6,671,337 B1 * | 12/2003 | Cordoba | 375/345 |
| 6,690,232 B2 * | 2/2004 | Ueno et al. | 330/85 |
| 6,750,719 B2 * | 6/2004 | Toyota et al. | 330/285 |
| 6,785,521 B2 * | 8/2004 | Hadjichristos et al. | 455/108 |
| 6,801,784 B1 * | 10/2004 | Rozenblit et al. | 455/522 |
| 6,853,836 B2 * | 2/2005 | Asam et al. | 455/126 |
| 6,898,257 B2 * | 5/2005 | Fischer et al. | 375/376 |
| 6,909,323 B2 * | 6/2005 | Ueno et al. | 330/86 |
| 6,930,549 B2 * | 8/2005 | Kajiwara et al. | 330/254 |
| 7,062,236 B2 * | 6/2006 | Midtgaard et al. | 455/126 |
| 7,072,421 B2 * | 7/2006 | Bengtsson et al. | 375/298 |
| 7,072,626 B2 * | 7/2006 | Hadjichristos | 455/126 |
| 7,076,223 B2 * | 7/2006 | Matsugatani et al. | 455/232.1 |
| 7,082,290 B2 * | 7/2006 | Takano et al. | 455/102 |
| 7,085,544 B2 * | 8/2006 | Takano et al. | 455/102 |
| 7,218,951 B2 * | 5/2007 | Rozenblit et al. | 455/522 |
| 7,260,367 B2 * | 8/2007 | McMorrow et al. | 455/108 |
| 2001/0028275 A1 * | 10/2001 | Matsugatani et al. | 330/281 |
| 2001/0055347 A1 * | 12/2001 | Fischer et al. | 375/302 |
| 2002/0071497 A1 * | 6/2002 | Bengtsson et al. | 375/298 |
| 2002/0090921 A1 * | 7/2002 | Midtgaard et al. | 455/126 |
| 2002/0137480 A1 * | 9/2002 | Hadjichristos et al. | 455/127 |
| 2002/0141510 A1 * | 10/2002 | Sridharan et al. | 375/300 |
| 2002/0196864 A1 * | 12/2002 | Booth et al. | 375/296 |
| 2003/0032397 A1 * | 2/2003 | Kuechler et al. | 455/127 |
| 2003/0139153 A1 * | 7/2003 | McMorrow et al. | 455/108 |
| 2003/0148749 A1 * | 8/2003 | Saito | 455/299 |
| 2003/0201834 A1 * | 10/2003 | Pehlke | 330/296 |
| 2003/0224740 A1 * | 12/2003 | Takano et al. | 455/102 |
| 2003/0227342 A1 * | 12/2003 | Liu | 332/145 |
| 2004/0014439 A1 * | 1/2004 | Matsugatani et al. | 455/126 |
| 2004/0083409 A1 * | 4/2004 | Rozenblit et al. | 714/48 |
| 2004/0185809 A1 * | 9/2004 | Jenkins | 455/127.2 |
| 2004/0203553 A1 * | 10/2004 | Toyota et al. | 455/333 |
| 2004/0219891 A1 * | 11/2004 | Hadjichristos | 455/102 |
| 2004/0242170 A1 * | 12/2004 | Gilbert | 455/127.1 |
| 2005/0007192 A1 * | 1/2005 | Miyagi | 330/141 |
| 2005/0009480 A1 * | 1/2005 | Vakilian et al. | 455/127.2 |
| 2005/0176388 A1 * | 8/2005 | Yamawaki et al. | 455/126 |
| 2006/0189285 A1 * | 8/2006 | Takano et al. | 455/127.2 |
| 2006/0217081 A1 * | 9/2006 | Takano et al. | 455/102 |

* cited by examiner

VARIABLE FILTER SYSTEMS AND METHODS FOR ENHANCED DATA RATE COMMUNICATION SYSTEMS

PRIORITY

The present application claims priority to U.S. Provisional Patent Application Ser. No. 60/475,193 filed Jun. 2, 2003.

BACKGROUND

The invention relates to the field of RF power detectors and controllers, and in particular to RF power detectors and controllers used in mobile handset terminals for wireless applications.

The demand for greater bandwidth for mobile systems in a highly competitive landscape has forced network providers to look for low cost ways to expand existing networks. One such system that is being used is Enhanced Data Rate for Global Evolution (EDGE). The EDGE system enables the providers to expand the existing Global System for Mobile Communications (GSM) system, the standard for 70% of the worldwide market, to offer bandwidths of up to 300 kbps. This bandwidth and capacity extension can be accomplished with a relatively small upgrade to the existing infrastructure network. The system, however, does present some technical challenges. One of these is in the transmitter section in the handset terminals.

The EDGE system uses a new modulation scheme to add the additional data capacity. The GSM system uses a Gaussian Minimum Shift Keying (GMSK) algorithm to encode the data in such a way that the transmitted signal has a constant envelope. The EDGE system, on the other hand, uses an 8-phase key shifting (PKS) algorithm that has an envelope with a 3.3 dB peak-to-average ratio; and a 17 dB overall variation in the amplitude. This amplitude variation requires that the transmitter amplify the signal with linearity. The most difficult section of the transmitter to make linear is the Power Amplifier (PA). The PA must produce the required amount of power to the antenna, with good DC to RF conversion efficiency to prolong battery life. This additional stipulation for linearity makes meeting the power and efficiency requirements much more difficult. Additionally, the transmitter and PA must also operate in GSM mode. Very little performance degradation can be tolerated in this mode since it will be used for the majority of voice traffic. Unfortunately, a PA designed to operate in a linear mode for EDGE will not be able to obtain the same peak efficiency in GSM mode.

Another problem arises with the detection and control of the RF output power. The existing GSM system has very rigid requirements for power ramping. Because the system is Time Division Multiple Access (TDMA), the transmitted energy falls into specific slots, or bursts, in time. Thus, a power control and detection scheme is used to control the power ramp and power level. A feedback control system is commonly used for this purpose. To meet the rise time requirements, a loop bandwidth on the order of several hundred kHz is needed. The EDGE system has similar ramping requirements. The AM modulation contained in the signal, however, is also on the order of about 280 kHz. This means that the feedback loop used for GSM would eliminate the amplitude modulation and distort the signal.

There is a need, therefore, for a system and method to more efficiently and economically providing an EDGE system.

SUMMARY

The invention provides a radio frequency output power control system is disclosed for use in communication systems that use a modulation scheme having a non-constant amplitude envelope. The system includes a power amplifier having a radio frequency input node for receiving a radio frequency input signal, a power control node for receiving a filtered power control signal, and an output for providing an amplified output signal. The system also includes a variable filter that receives a power control signal at a power control input and a receives a trigger signal at a trigger input, and provides a filtered power control signal to the power control node of the power amplifier responsive to the power control signal and the trigger signal in accordance with an embodiment.

In accordance with other embodiments, the power control node receives an RMS filtered AM modulated control signal and the system includes an envelope detection unit that receives the radio frequency input signal. In accordance with further embodiments, the system includes an input directional coupler, an output directional coupler and the variable filter provides at least two different filter functions responsive to a trigger signal. In further embodiments, the invention provides a method of providing radio frequency output control in a communication system that uses a modulation scheme having a non-constant amplitude envelope. The method includes the steps of receiving a radio frequency input signal at a radio frequency input node of a power amplifier having, receiving a filtered power control signal at a power control node of the power amplifier, providing an amplified output signal from the power amplifier, receiving a power control signal at a power control input of a variable filter, receiving a trigger signal at a trigger input of the variable filter, and providing a filtered power control signal to the power control node of the power amplifier responsive to the power control signal and the trigger signal.

BRIEF DESCRIPTION OF THE DRAWINGS

The following description may be further understood with reference to the accompanying drawings in which.

The drawings are shown for illustrative purposes only.

DETAILED DESCRIPTION OF THE ILLUSTRATED EMBODIMENTS

Figure 1:
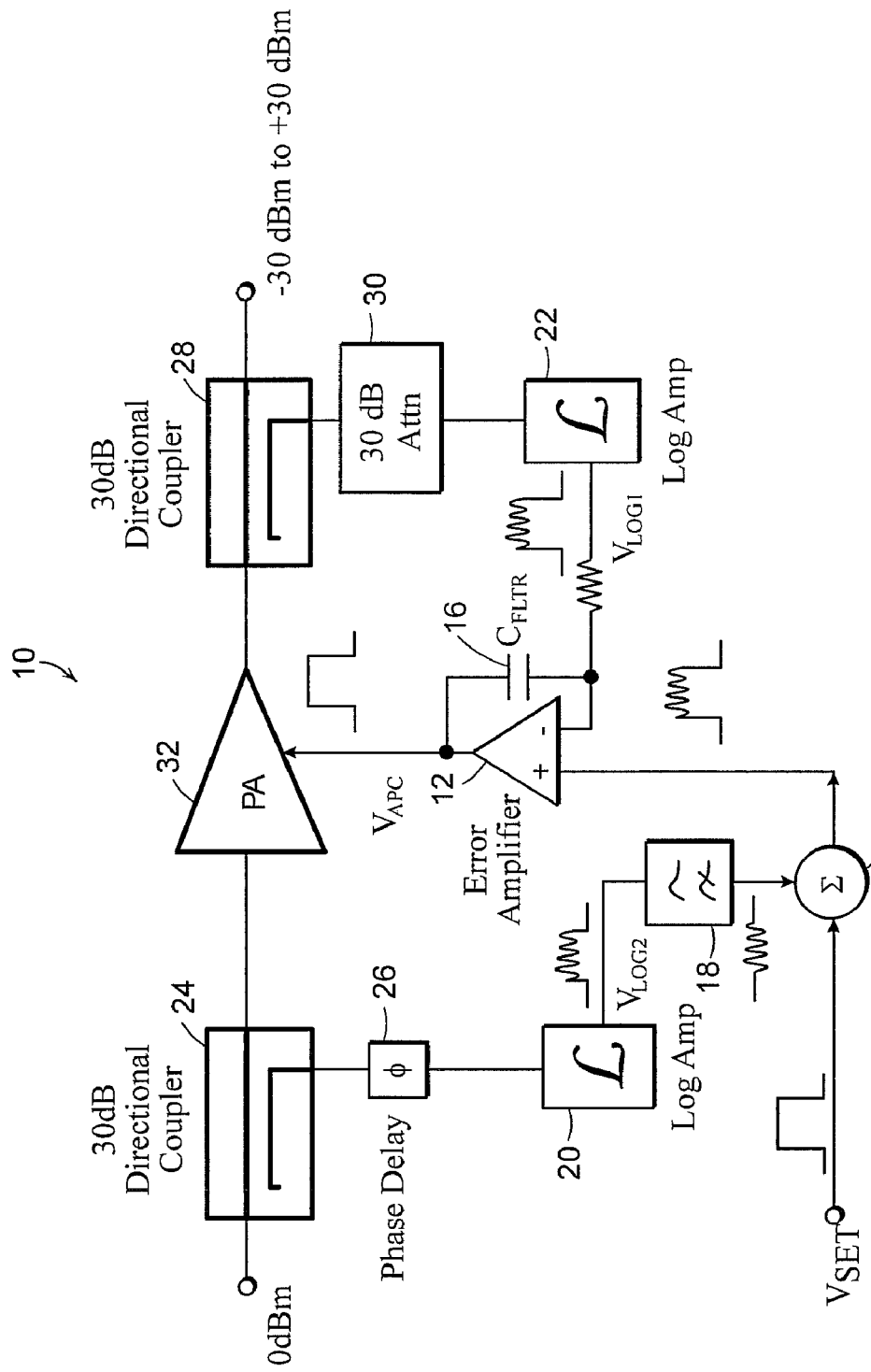
FIG. 1 shows an illustrative diagrammatic view of a power detector/controller system in which a variable filter system of the invention may be used.

A variable filter system in accordance with an embodiment of the invention may be used in a power detector/controller system as disclosed, for example, in U.S. Published Patent Application No. 2003/0139153 (the disclosure of which is hereby incorporated by reference). In particular, as shown in FIG. 1 a system 10 may include a differential amplifier 12, a sum node 14, a filter capacitor 16, a filter 18, and demodulating detectors 20 and 22 that are logarithmic amplifiers.

A 30 dB directional coupler 24 couples the input signal to input log amp 20 via phase shifter 26, which delays the input signal to align it to the output signal. Input log amp 20 translates the power of the input signal into a voltage that includes any voltage ripple resulting when input signals have a non-constant amplitude envelope. The output of input log amp 20 is coupled via filter 18 to remove its DC component. This signal is then added to the ramp control signal, $V_{SET}$, at summing node 14 to create a composite ramp control/AM variation signal. The composite signal is then applied to the positive input of differential amplifier 12, which is configured as a difference integrator. A 30 dB directional coupler 28 couples the output to a 30 dB attenuator 30, which attenuates the output signal before providing it to output log amp 22.

The output log amp 22 translates the power of the output signal into a voltage that includes any voltage ripple resulting when input signals have a non-constant amplitude envelope. This signal is applied to the negative input of differential amplifier 12, which then compares the composite signal to the output of log amp 22. Any differences in these signals will result in a corrective signal $V_{apc}$ being applied to the PA's $V_{apc}$ input.

The filter 18 may be an AC-coupling capacitor that provides a high-pass filter function The power control problem could be solved, therefore, by simultaneously detecting both the input and output waveforms and using the AM modulation on the input waveform to cancel the modulation from the control signal while allowing the envelope of the signal to pass. Any non-linearities in the power amplifier would create an error signal on top of the control signal to correct the distortion caused by the PA. This effectively linearizes the power amplifier and enables it to have the same performance in the GSM mode as a mode specific PA. The most straightforward implementation of this process, however, produces gain control, not power control. This is because the control signal is simply the detected output power minus the detected input power. Although a high-pass filter may be used in the input detection branch to eliminate the average power from the signal while allowing the envelope information to pass, the complexities associated with the full communications system make this solution difficult to realize.

Figure 2A:
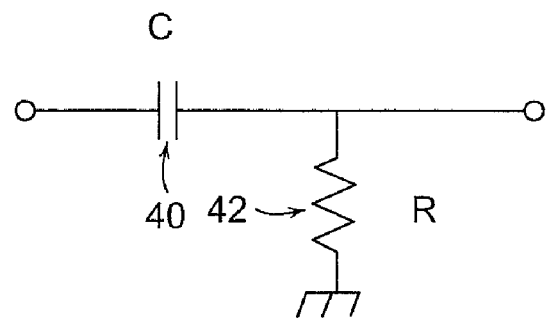
FIGS. 2A-2C show illustrative diagrammatic views of a transient response from a high pass filter in accordance with an implementation of a system of FIG. 1.

The high-pass voltage filter in the detector/controller system of FIG. 1, may be a simple capacitor, or may include a network of capacitors, inductors, resistors, and/or active circuitry to create a multi-pole filter. Alternatively, for circuits operated in current mode this filter could also be implemented as a high-pass current filter, using instead a shunt inductor rather than a series capacitor. For this system to work properly, the envelope signal that is passed by the filter should be close to the original envelope waveform. Any deviation may cause distortion in the full system. Also, because a log amp is used in the preferred embodiment, the envelope is spread in frequency due to the non-linear logarithmic function. Thus, the high-pass filter must have a low frequency cut-off of less than about 1 kHz in order to limit the distortion to within acceptable limits. A filter meeting this requirement can be made from a series capacitor 40 (e.g., 22 nF) and a shunt resistor 42 (e.g., 7.2 k ohms) as shown in FIG. 2A. Multi-pole filters could also be employed to have a sharper cut-off and varying degrees of pass-band ripple.

Figure 2B:
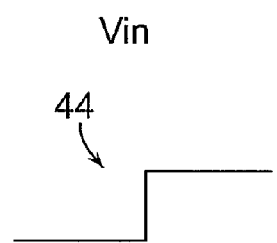
Figure 2C:
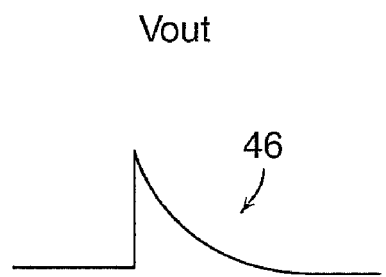

A high-pass filter with a cut-off this low, however, will have a very slow response to changes in the average power. A DC voltage will characterize the average power detected by the log-amp. A change in this DC voltage will cause an initial offset at the filter output. The offset will then decay according to following equation:

$$V = e^{\frac{-\tau}{RC}} = e^{-\tau P_1}$$

Where $P_1$ is the dominant pole. This transient response is shown in FIGS. 2B and 2C where FIG. 2B shows the input voltage versus time at 44 and FIG. 2C shows the output voltage versus time at 46. No problem would exist if the input power remained on, with a constant level. To save power in the handset however, the VCO, which provides the RF input power to the PA, is turned on only about 20 μs prior to the transmit slot. The cut-off requirements of the filter demand that there will be a significant offset within 20 μs of this transition that will create signal distortion.

Figure 3:
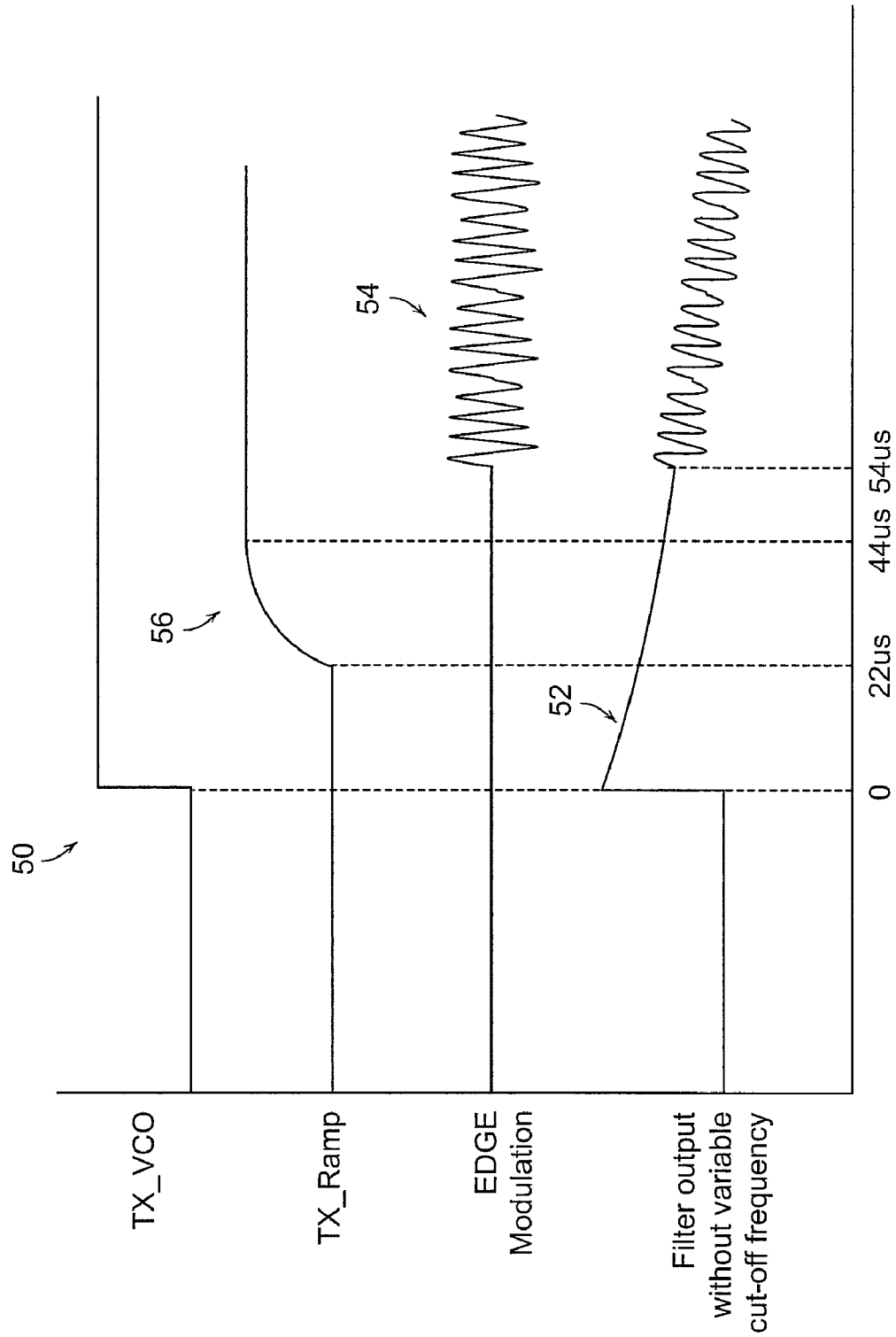
FIG. 3 shows an illustrative diagrammatic view of a timing diagram showing an operation of the power detector/controller system of FIG. 1 under certain conditions.

To illustrate this problem, the timing diagram for a typical handset architecture for GSM/EDGE is shown in FIG. 3. The signal Tx_VCO (shown at 50) designates the trigger that turns on the transmit VCO, e.g. at time 0 as shown. At this time, the input power to the PA jumps from nothing to between 0 dBm and 10 dBm depending on the type of VCO used. In order to ensure that no distortion is present, this transient generated in the high-pass filter (as shown at 52) due to the step in the log amp detector output must decay to a fraction of the smallest AM signal that is detected before the start of the transmit burst as shown at 54.

A log amp will produce an output voltage proportional to the detected power level according to the following linear relationship:

$$Pout = Slope * V_{det} + intercept$$

A typical log amp might have a Slope of 30 dBN and an Intercept of −18 dBm. The minimum AM modulation on the EDGE signal will be 14 dB below the average power. If we take 5 dBm as a typical RE input power, then we must be able to detect −9 dBm with minimal error to ensure that there is no distortion. From the above equation, 5 dBm will produce a detected voltage of 0.77V, and 14 dB below that (−9 dBm), will produce 0.3V. To minimize distortion the decay from the VCO transient should decay to less than 1/10 the minimum voltage, or 0.03V. This will take ln(0.77/0.03)/P1=516 μs. This is significantly longer than the time before the start of the transmit burst. In fact, the transient will only decay by about 87% by the time the PA ramp (as shown at 56) begins, and by 72% at the start of the EDGE modulation 54.

Figure 4A:
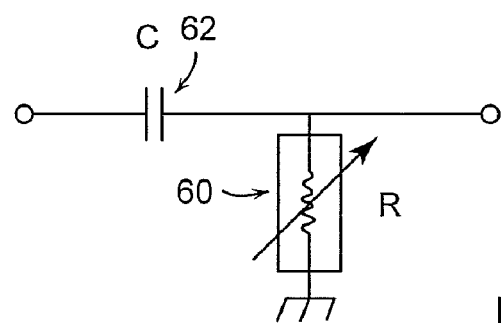
FIGS. 4A-4D show illustrative diagrammatic views of a variable filter, and its input, mode control, and output for a system in accordance with an embodiment of the invention.
Figure 4B:
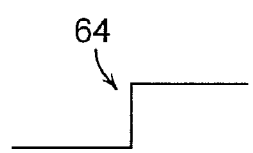
Figure 4C:
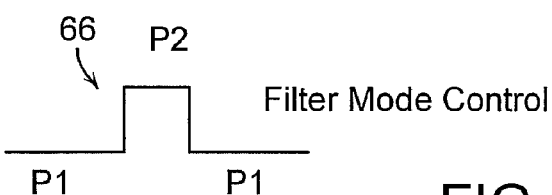
Figure 4D:
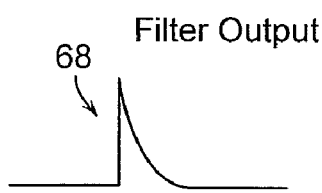
Figure 5:
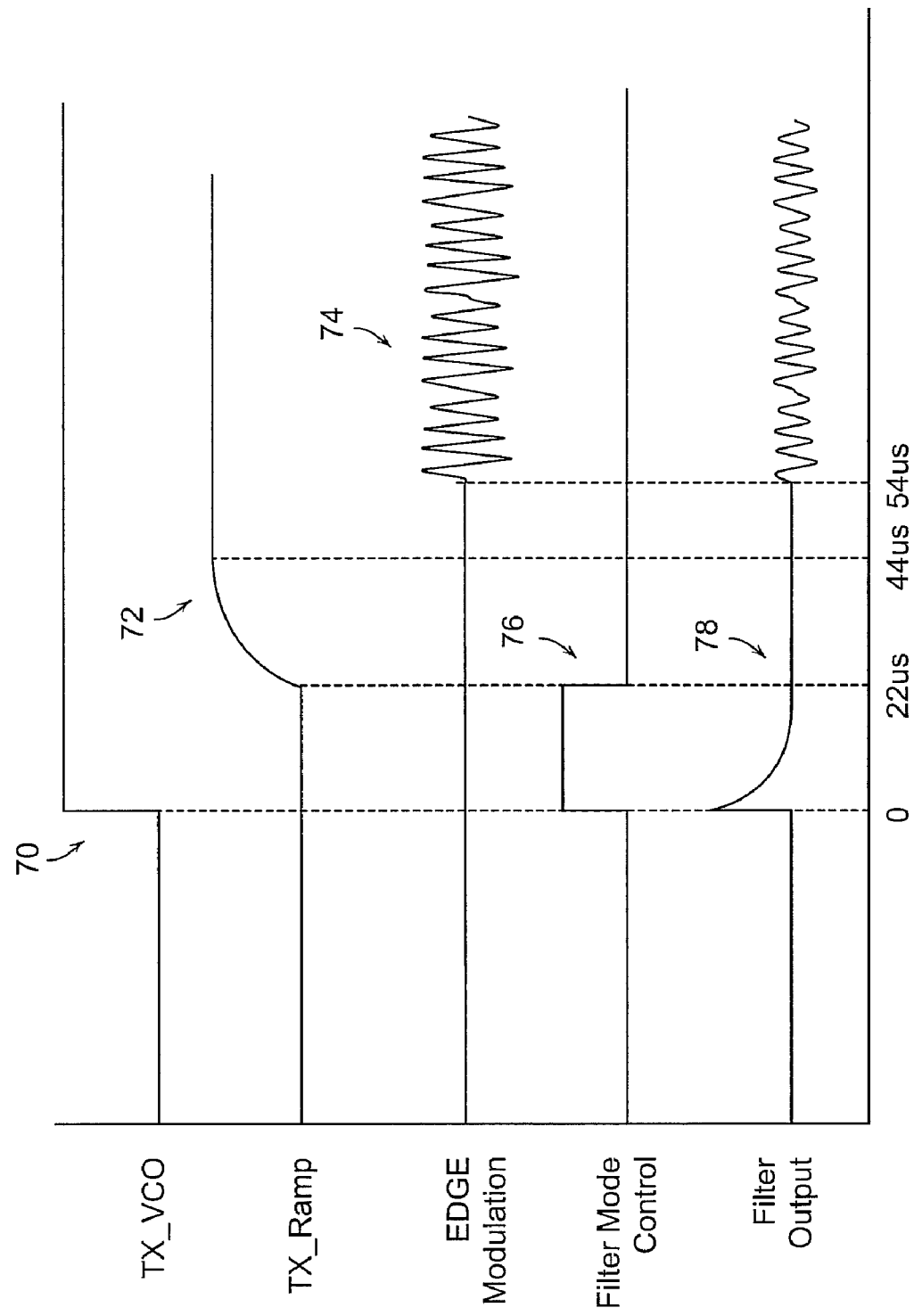
FIG. 5 shows an illustrative diagrammatic view of a timing diagram for a system in accordance with an embodiment of the invention.

A solution to this problem is to provide the filter 18 with a variable time constant, for example using a variable resistor 60 with a series capacitor 62 as shown in FIG. 4A. When the filter input rises as shown at 64 in FIG. 4B, the filter is temporarily switched to a cut off frequency, $P_2$, which is much higher than $P_1$, as shown at 66 in FIG. 4C. This allows the transient to decay much faster as shown at 68 in FIG. 4D. The dominant filter pole must then be switched back to $P_1$ prior to the start of the transmit burst. FIG. 5 shows the resulting transient waveforms where the Tx_VCO is shown at 70, the Tx_Ramp is shown at 72, the EDGE modulation signal is shown at 74, the filter mode control is shown at 76 and the filter output is shown at 78.

Figure 6:
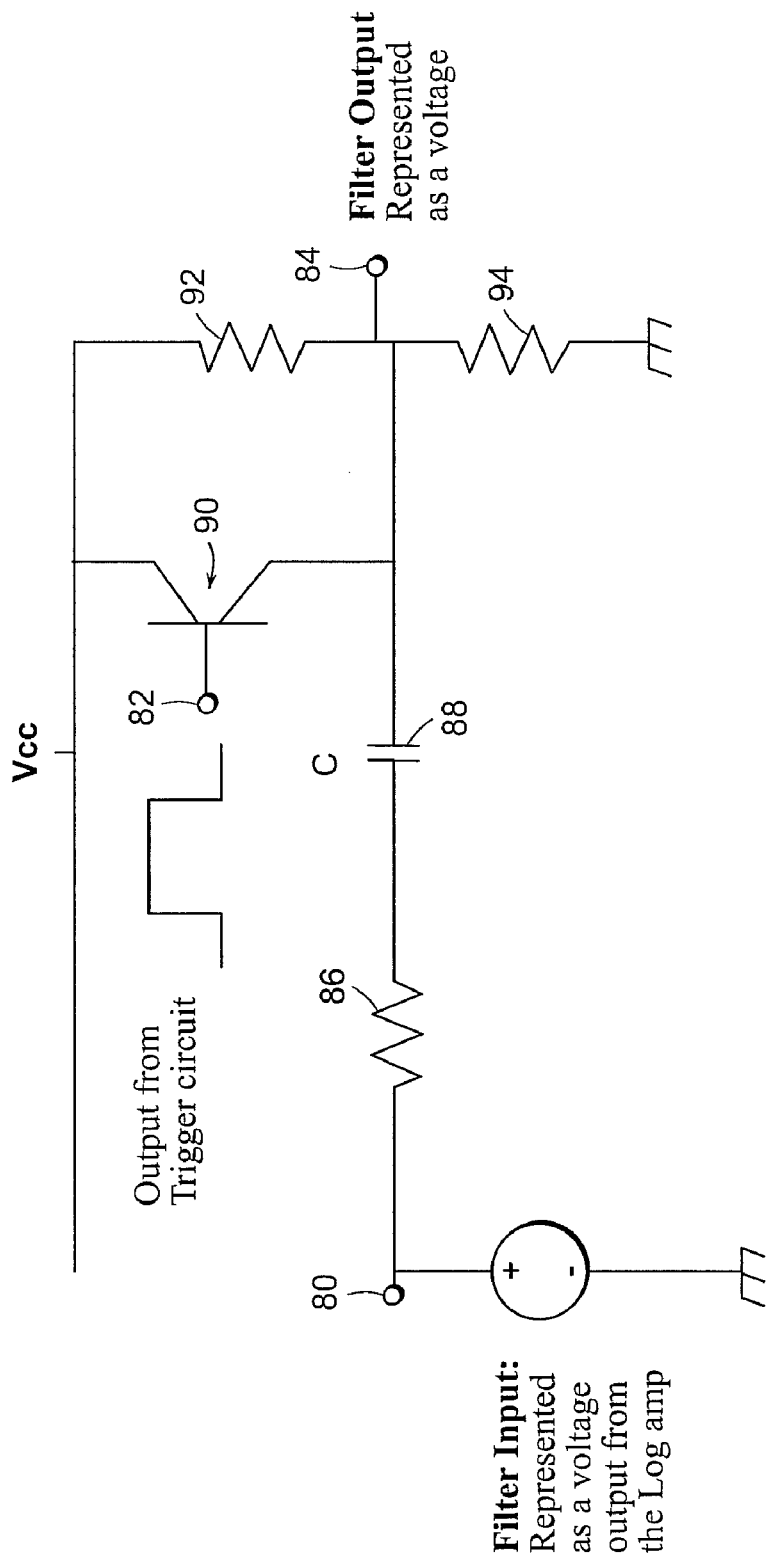
FIG. 6 shows an illustrative diagrammatic view of a variable filter circuit for a system in accordance with another embodiment of the invention.

The variable filter may be made in a number of ways. The example shown in FIG. 4A uses a variable load resistor 60 to change the time constant. Many other approaches for forming variable filters may be employed, such as active filters, and filters that use varactors as the variable elements. An example of a single-ended implementation is shown in FIG. 6 and includes a filter input 80 that is represented as a voltage output from the log amp, a trigger input 82 that is provided by an output of a trigger circuit, and a filter output 84 that is represented as a voltage. The circuit further includes a series resistor 86 and capacitor 88 that are coupled to an emitter of a transistor 90, whose base is coupled to the trigger input 82 and collector is coupled to Vcc. The emitter of transistor 90 is also coupled to a resistor divider circuit between Vcc and ground that includes resistors 92 and 94 as shown, and the filter output 84 is taken from the emitter. In this case, the effective resistance determining $P_2$ is the small resistance seen looking into the emitter of the switching transistor, with the transistor providing the increased current required to quickly discharge the capacitor. In this implementation great care must be taken that the output voltage of the high-pass filter is correct at the end of the switching cycle.

Figure 7:
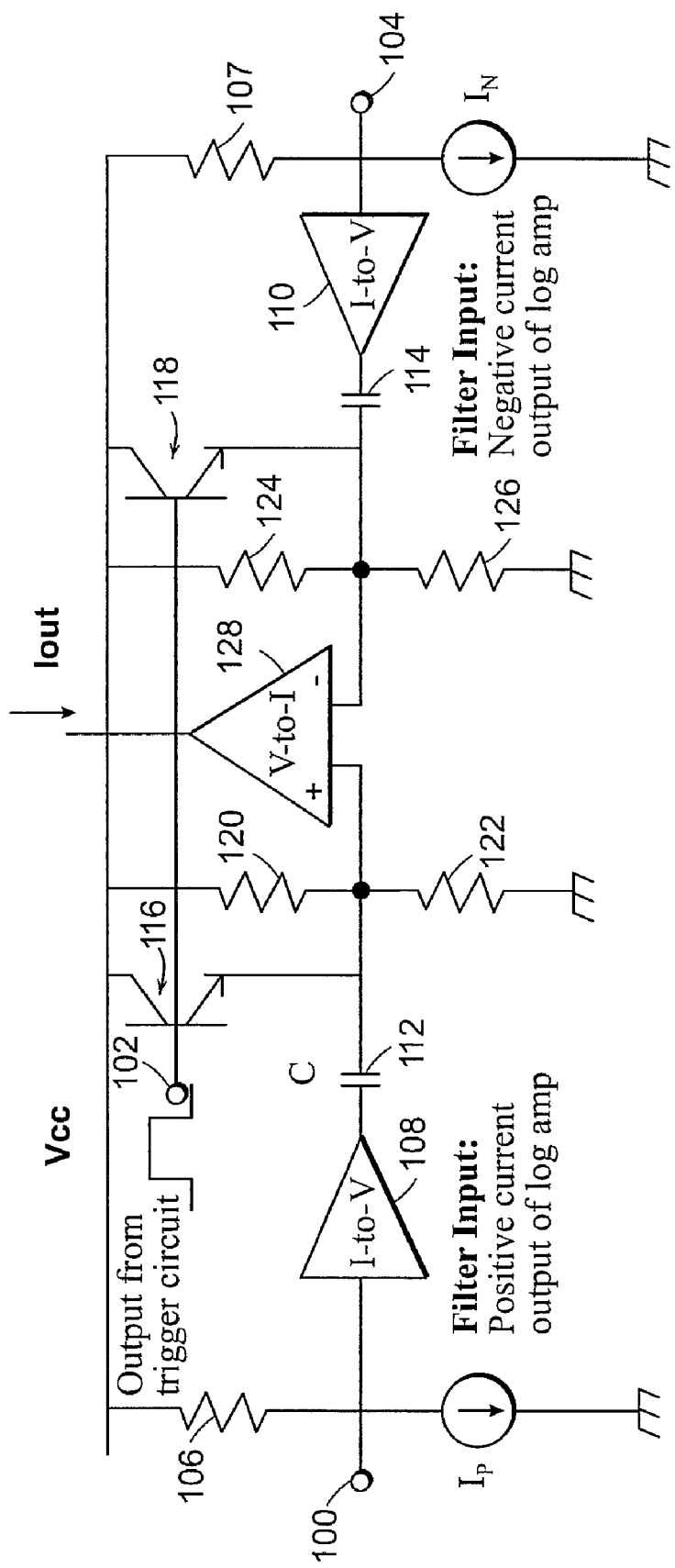
FIG. 7 shows an illustrative diagrammatic view of a differential variable filter circuit for a system in accordance with another embodiment of the invention.

In further embodiments, the variable filter may comprise a differential variable filter as shown in FIG. 7. The variable filter circuit of FIG. 7 is implemented as a differential circuit and includes a filter input 100 that is represented as a positive current output of a log amp, a trigger input 102 and a filter output 104 that provides a negative current output of a log amp. The circuit also includes resistors 106 and 107 between the filter input 100 and Vcc, and between the filter output 104 and Vcc respectively, as well as a pair of current to voltage converters 108 and 110, a pair of capacitors 112 and 114, and a pair of transistors 116 and 118 as shown. The circuit further includes a first resistor divider circuit with resistors 120 and 122, and a second resistor divider circuit with resistors 124 and 126, as well as a voltage to current converter 128, that provides a negative current output. In this case, the log amp output is a differential current, and the high-pass filter is applied to each leg of the differential current. In order to apply a high-pass voltage filter, this current must be converted to a voltage that can source/sink varying amounts of current. This is an important point in order for the filter switching to work; an increasing amount of displacement current will be required to discharge the capacitor while maintaining a constant input voltage.

The capacitor forming each high-pass filter is 22 nF, and is implemented as an off-chip capacitor. This differential implementation has a significant advantage because the input to the V-to-I converter must now faithfully represent only the voltage difference between the individual I-to-V outputs, and therefore is tolerant of a residual common-mode signal that may be present at the end of the switching cycle. Many further implementations should be obvious to one skilled in the art.

The current-to-voltage conversion is only necessary because of the implementation of the high-pass filter as a voltage filter using a series capacitor. A more direct implementation would be to apply a current filter to the log amp outputs using a shunt inductor element. However, a 1 kHz cut-off frequency is required for this application, and limitations exist on the size of the resistors due circuit practicalities.

Figure 8:
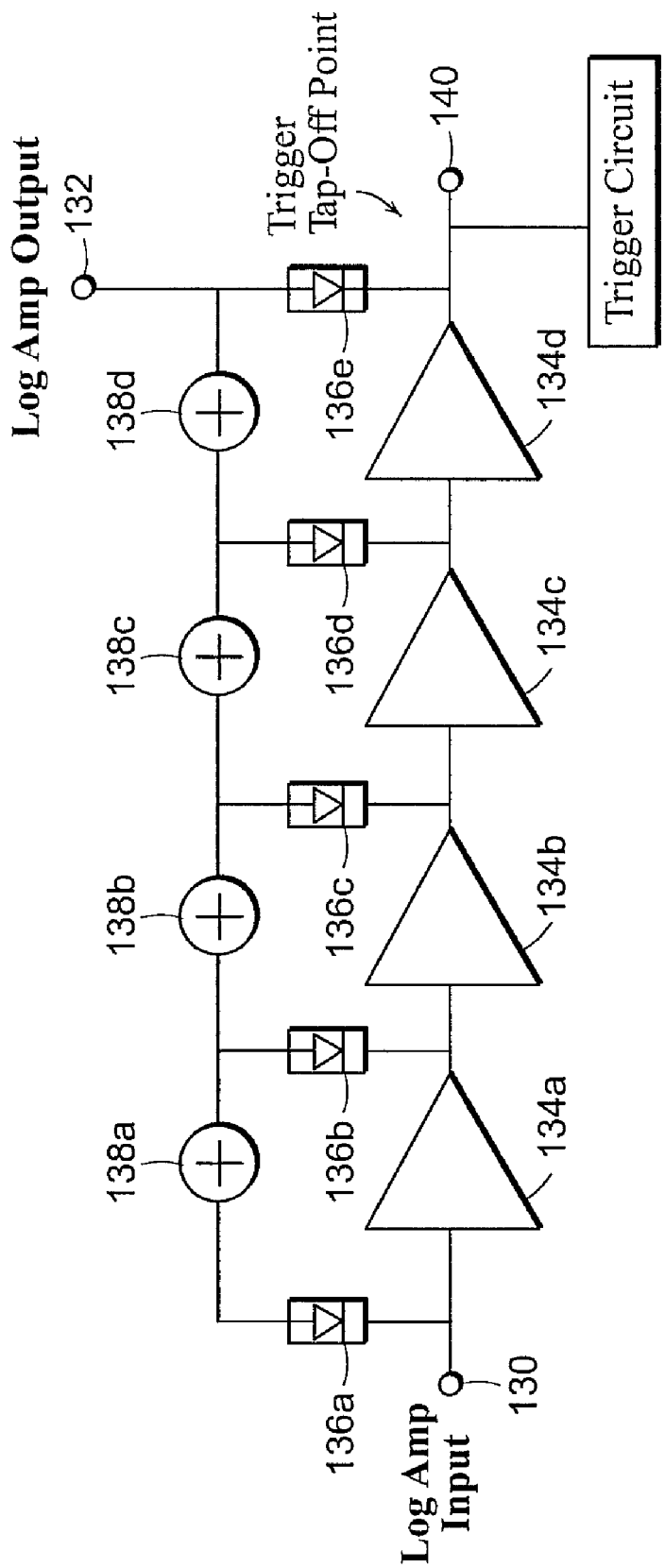
FIG. 8 shows an illustrative diagrammatic view of a log amplifier for use in a system in accordance with a further embodiment of the invention.

The variable filter requires a control signal to switch between the two time constants. This signal can either be provided externally or generated by some means inside the detector circuit. Another aspect of this invention is the way in which this signal may be created. The step response created when the VCO turns on can be used to create the trigger. Essentially, the unwanted transient is used to enable the circuit that will eliminate it. A portion of the input power can be processed directly to provide the trigger. Alternatively, there are many points within the log amp circuit where an amplified version of the transient can be taken. This eliminates the need for some redundant circuitry. In an embodiment, it may be taken from the output of the last stage in the log amp as shown in FIG. 8. In particular, the log amplifier of FIG. 8 includes a log amp input 130, a log amp output 132, and a series of stages that include amplifiers 134a-134d, diodes 136a-136e, and summers 138a-138d. The output 140 of the last amplifier stage is the point where the RF input has been amplified the most and will have the sharpest response.

Figure 9:
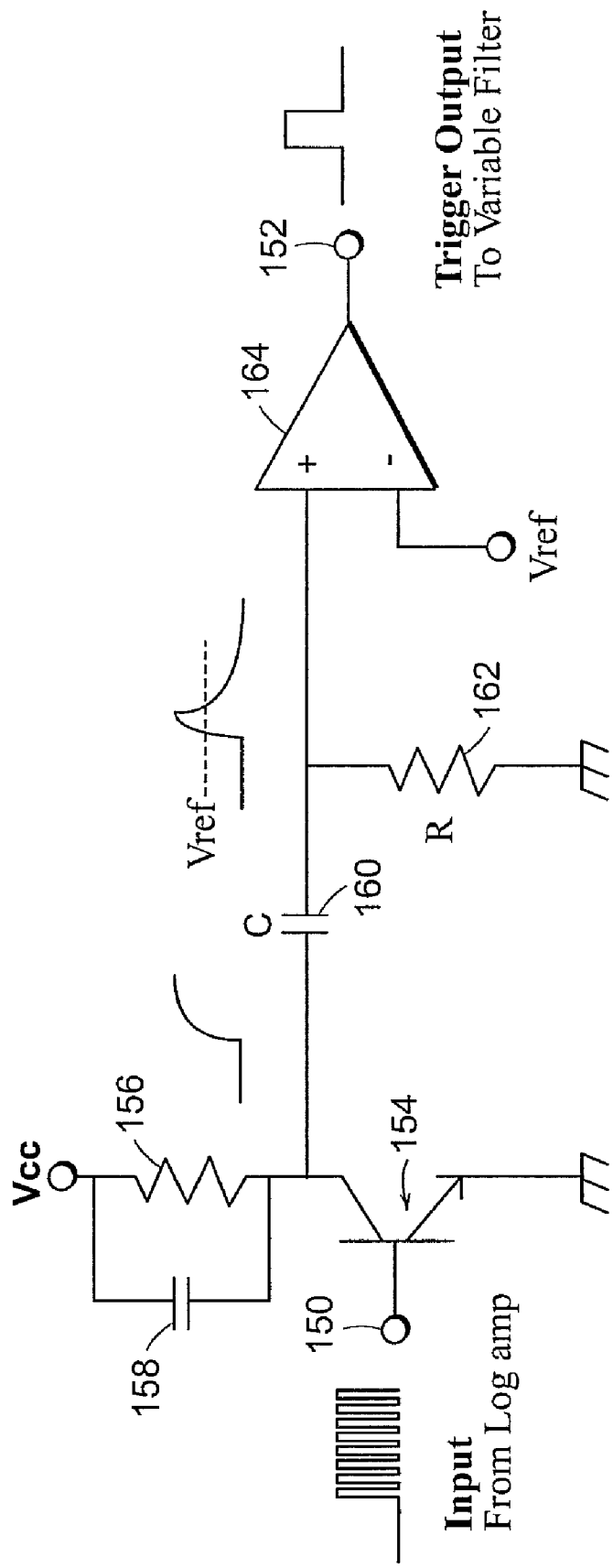
FIG. 9 shows an illustrative diagrammatic view of a trigger circuit for use in a system in accordance with a further embodiment of the invention.

The time at which the filter switches back to the low time constant may be controlled by using a one-shot multi-vibrator circuit. An RC filter may be used to set the length of time that the trigger will be active. For example, as shown in FIG. 9, a trigger circuit may include an input 150 from a log amp, and a trigger output 152. The input 150 is coupled to a base of a transistor 154 whose emitter is grounded and whose collector is coupled to Vcc through a resistor 156 and capacitor 158 in parallel with one another. The collector is also coupled through a series capacitor 160 and shunt resistor 162 to ground, to a positive input of an amplifier 164. The negative input to the amplifier 164 is coupled to a reference voltage such that the output of the amplifier provides the desired trigger output signal. There are many further ways to implement this circuit once the initial trigger has been acquired that will be obvious to those skilled in the art.

Those skilled in the art will appreciate that numerous modifications and variations may be made to the above disclosed embodiments without departing from the spirit and scope of the invention.

What is claimed is:

1. A radio frequency output power control system for use in communication systems that use a modulation scheme having a non-constant amplitude envelope, the system comprising:

a power amplifier comprising a radio frequency input node for receiving a radio frequency input signal, a power control node for receiving a power control signal, and an output for providing an amplified output signal;

an envelope detection unit that receives the radio frequency input signal and provides a positive current output and a negative current output in accordance therewith;

a differential variable filter that converts the positive current output to a positive voltage output, converts the negative current output to a negative voltage output, filters the positive and negative voltage outputs, and provides a filtered power signal while allowing the envelope of the power signal to pass; and a comparison unit that compares the filtered power signal to a power level of the amplified output signal and provides the error signal to the power control node of the power amplifier to cancel amplitude modulation from the amplified output signal, wherein the variable filter has a first time constant for providing a fast transient response to changes in a power level of the input signal and a second time constant for filtering the input signal.

2. The radio frequency output power control system of claim 1, wherein the power control signal comprises envelope amplitude information.

3. The radio frequency output power control system of claim 1, wherein the power control signal is received via a demodulating detector.

4. The radio frequency output power control system of claim 1, wherein a trigger signal for changing a time constant of the variable filter is provided responsive to the presence of the radio frequency input signal to the power amplifier.

5. The radio frequency output power control system of claim 1, wherein the envelope detection unit further comprises a log detector.

6. The radio frequency output power control system of claim 1, wherein the system further comprises an output feedback loop coupled to the power control signal.

7. The radio frequency output power control system of claim 6, wherein the variable filter is coupled to the power amplifier via an error amplifier that receives a variable filter output signal from the variable filter and a feedback signal from the output feedback loop.

8. The radio frequency output power control system of claim 1, wherein the system is employed to control power for an EDGE system.

9. The radio frequency output power control system of claim 1, wherein a trigger signal for changing a time constant of the variable filter is provided by a one-shot multi-vibrator circuit.

10. The system of claim 1, wherein the power control signal is a root-mean-squared filtered amplitude modulated signal.

11. The system of claim 1, wherein the second time constant provides a low-frequency cut-off of less than approximately 1 kHz.

12. The system of claim 1, wherein the differential variable filter further comprises a voltage-to-current converter for converting the filtered positive and negative voltage outputs to a current.

13. A radio frequency output power control system comprising:
  a power amplifier for amplifying an input signal and for providing an amplified output signal, the power amplifier comprising a control node for receiving a control signal for correcting distortion in the amplified output signal;
  an input power detector for detecting a power level of the input signal and for providing an input voltage level signal, the input power detector comprising a differential variable filter having a first time constant for providing a fast transient response to changes in the power level of the input signal and a second time constant for filtering the input signal, the differential variable filter comprising a differential current-to-voltage converter for converting a received differential current into a differential voltage and a differential filter element for filtering the differential voltage;
  an output power level detector for detecting a power level of the amplified output signal and providing an output voltage level signal; and
  a comparison unit for comparing the input voltage level signal to the output voltage level signal and for generating the control signal based on the comparison.

14. The radio frequency output control system of claim 13, wherein the system is employed to control power for an EDGE system.

15. The radio frequency output control system of claim 13, wherein a time constant of the variable filter changes in response to a change in the input signal.

16. The radio frequency output control system of claim 13, wherein a time constant of the variable filter changes in response to an output of a one-shot multi-vibrator circuit.

17. The radio frequency output control system of claim 13, wherein the variable filter is coupled to the power amplifier via an error amplifier.

18. The system of claim 13, wherein the first time constant allows an output voltage of the variable filter to quickly respond to changes in the power level of the input signal.

19. The system of claim 13, wherein the differential variable filter further comprises a voltage-to-current converter for converting the filtered differential voltage to a current.

20. A method for amplifying a radio frequency output signal comprising:
  receiving an input signal at a power amplifier, the power amplifier configured to provide an amplified output signal;
  sensing an input power level of the input signal with an input power detector, the input power detector comprising a log amp for providing a differential current signal representing the input power level and a variable filter for converting the differential current signal to a differential voltage signal and for filtering the differential voltage signal;
  assigning a first time constant to the variable filter in response to a change in a power level of the input signal, the first time constant having a fast transient response to the change in the power level;
  thereafter assigning a second time constant to the variable filter, the second time constant selected for filtering the input signal;
  sensing an output power level of the amplified output signal with an output power detector;
  comparing the input power level to the output power level; and
  adjusting the power amplifier, based on the result of the comparison, to linearize the amplified output signal.

21. The method of claim 20, wherein the change in the power level of the input signal is caused by exiting a power-saving mode.

22. The method of claim 20, wherein the second time constant is assigned in response to one of a change in the input signal or a change in an output of a one-shot multi-vibrator circuit.

23. The method of claim 20, wherein the input power detector further comprises an error amplifier.

24. The method of claim 20, wherein the differential variable filter further comprises a voltage-to-current converter for converting the filtered differential voltage signal to a current.

25. The method of claim 20, wherein the second time constant provides a low-frequency cut-off of less than approximately 1 kHz.

* * * * *